United States Patent
Mori et al.

(10) Patent No.: US 6,759,866 B2
(45) Date of Patent: Jul. 6, 2004

(54) SEMICONDUCTOR INTEGRATED CIRCUIT AND A TESTING METHOD THEREOF

(75) Inventors: Katsuhiro Mori, Kawasaki (JP); Shinya Fujioka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/274,602

(22) Filed: Oct. 22, 2002

(65) Prior Publication Data

US 2003/0098456 A1 May 29, 2003

(30) Foreign Application Priority Data

Nov. 29, 2001 (JP) ........................................ 2001-364685

(51) Int. Cl.[7] ............................................. G01R 31/28
(52) U.S. Cl. ..................... 324/765; 324/158.1
(58) Field of Search ............................. 324/765, 158.1, 324/758, 760, 763

(56) References Cited

U.S. PATENT DOCUMENTS

| 5,557,232 A | * 9/1996 | Shimogawa ................. 327/545 |
| 5,694,364 A | * 12/1997 | Morishita et al. ........... 365/201 |
| 5,999,009 A | * 12/1999 | Mitsui ......................... 324/765 |

* cited by examiner

*Primary Examiner*—Ernest Karlsen
(74) *Attorney, Agent, or Firm*—Arent Fox PLLC

(57) ABSTRACT

Operating margins of a semiconductor integrated circuit are reliably tested at low power consumption by switching power supply circuits between normal operation mode wherein a first step-up power supply serves both memory core and a step-down power supply, and testing mode wherein the memory core is powered by an external testing power supply that provides a fluctuating voltage for testing, and the step-down power supply is served by a second step-up power supply.

8 Claims, 14 Drawing Sheets

SEMICONDUCTOR INTEGRATED CIRCUIT AND A TESTING METHOD THEREOF

BACKGROUND OF THE INVENTION

1. Field of the Invention

The present invention generally relates to a semiconductor integrated circuit and a testing method thereof, and especially relates to the semiconductor integrated circuit, operational margins of which can be tested by causing a voltage applied to a step-up power supply line to fluctuate, and the testing method thereof.

2. Description of the Related Art

Battery-driven electronic apparatuses, such as a notebook type PC (Personal Computer) and a cellular telephone terminal, are expanding use of DRAM (Dynamic Random Access Memory). In order to prolong life of a battery used by the apparatuses, the apparatuses are required to operate with minimum power consumption.

Then, in order to reduce the power consumption in DRAM, conventional practices have been to lower the external power supply voltage, and to use the lowered voltage as the operational power supply voltage.

A conventional semiconductor integrated circuit is explained with reference to a semiconductor integrated circuit DRAM 5 shown in FIG. 1. The semiconductor integrated circuit DRAM 5 shown in FIG. 1 consists of a memory core 1, an interface circuit 2, a logic circuit 3, and a power supply circuit 4. The interface circuit 2 receives an address signal and a control signal from an address control line Add-Contl, and a data signal through a data line (DQ) from a CPU (Central Processing Unit) that is not illustrated, provides the above-mentioned signals to the logic circuit 3, receives signals from the logic circuit 3, and provides the received signals to the CPU through the data line (DQ). The logic circuit 3 generates a control signal that determines operation timing of each of the internal circuits, based on the address signal, the control signal, and the like received from the CPU, performs writing to and reading from the memory core 1, and generates writing data and reading data. The power supply circuit 4 supplies predetermined voltages to the memory core 1, the interface circuit 2, and the logic circuit 3, receiving power from an external power supply (a high voltage Vdd and a ground voltage Vss).

Power supplies that the power supply circuit 4 provides are explained with reference to FIG. 2. The power supply circuit 4 provides a step-down power supply 12, a step-up power supply 13, a pre-charge power supply 14, and a negative power supply 15 to an internal circuit 6 that includes the memory core 1, the interface circuit 2, and the logic circuit 3.

The step-down power supply 12, the step-up power supply 13, the pre-charge power supply 14 and the negative voltage power supply 15 generate and provide respectively predetermined voltages, referring to a reference voltage that a reference voltage generator 11 outputs.

The step-down power supply 12 generates a voltage that serves an internal power supply voltage, which is supplied to, e.g., a bit line of the memory core 1, the interface circuit 2, and the logic circuit 3. The step-up power supply 13 generates an elevated voltage, which is supplied to, e.g., a word line of the memory core 1. The pre-charge power supply 14 supplies a pre-charge voltage, e.g., to the memory core 1. The negative voltage power supply 15 provides a back bias to a transistor that constitutes a memory cell of the memory core 1, the memory cell storing an electric charge.

FIG. 3 shows relationships among voltages output from the step-down power supply 12, the step-up power supply 13, the pre-charge power supply 14, and the negative power supply 15, when the external power supply is turned on, and as the external power supply voltage Vcc increases from zero volts. The voltage output from the negative power supply 15 serves as Vbb 21 (a negative voltage), when the external power supply voltage Vcc reaches a predetermined voltage. The voltage output from the pre-charge power supply 14 serves as Vpr 22 (a pre-charge voltage), when the external power supply voltage Vcc reaches a predetermined voltage. Similarly, the voltages output from the step-down power supply 12 and the step-up power supply 13 are set to Vii 23 (an internal power supply voltage) and Vpp 24 (an elevated voltage), respectively, when the external power supply voltage Vcc reaches a predetermined voltage.

FIG. 4 shows an example of a reference voltage generating circuit of the reference voltage generator 11. The reference voltage generating circuit includes pMOS 31, pMOS 32, nMOS 33, nMOS 34, a buffer amplifier 35, and a resistance element 36.

The pMOS 31 and pMOS 32 serve as a current mirror circuit. Here, if the power supply voltage Vcc rises, then, current through the pMOS 31 increases, and the nMOS 34 enters a deep conductive state, which increases the voltage drop through the resistance element 36, and the voltage of a point B rises. Consequently, the nMOS 33 enters a deep conductive state, and the voltage of a point A falls. Conversely, if the power supply voltage Vcc falls, the voltage of the point A rises. Thus, the point A provides a voltage that is stable against a change of the power supply voltage Vcc.

Although the voltage of the point A is compensated against changes of temperature and the external power supply voltage, an influence of a variation in the transistor that constitutes the circuit remains. In order to cope with this, the buffer amplifier 35 is connected to the point A such that the variation in the transistor is removed, and the reference voltage generator 11 outputs the reference voltage (Vref).

FIG. 5 shows an example of a pMOS regulated power supply, which is explained hereunder. The pMOS regulated power supply shown at (A) of FIG. 5 includes pMOS 41, pMOS 42, pMOS 43, nMOS 44, nMOS 45, and nMOS 46. Here, the pMOS 41 and pMOS 42 serve as a current mirror circuit; the nMOS 44, nMOS 45, and nMOS 46 serve as a differential amplifier 48; and the pMOS 43 functions as a driver 47. The pMOS regulated power supply receives the external power supply voltage Vcc, which serves as the elevated voltage, and the grounding voltage Vss as the lowest voltage. The pMOS regulated power supply shown at (A) of FIG. 5 can be represented in a simple way as shown in (B) of FIG. 5.

Next, operations of the pMOS regulated power supply are described. The differential amplifier 48 compares the output voltage Vii of the driver 47 with the reference voltage Vref, and controls such that the difference between the two voltages, namely, Vref-Vii, becomes zero. Consequently, the output voltage Vii of the driver 47 finally becomes the same voltage as the reference voltage Vref.

The pMOS regulated power supply shown in FIG. 5 has features such as follows:

(1) the output voltage Vii obtained is independent of load current because of a negative feedback to the output voltage Vii of the driver 47;

(2) since the external power supply voltage is applied to the source electrode of the driver 47, sensitivity tends to be high to the noise of the external power supply voltage Vcc; and (3) in order to enhance the stability of the output voltage Vii against load current change, it is necessary to improve the response of the differential amplifier 48, which causes the current drain of the differential amplifier 48 to become large in the magnitude of mA.

Advantages of the pMOS regulated power supply include a high flat property of the generated voltage, and a space-saving feature. Disadvantages include high susceptibility to noise, and large power consumption required. Here, the high flat property refers to a property that there is little fluctuation in the output voltage when the load varies and/or little influence when the external power supply voltage is made close to the internal power supply voltage.

FIG. 6 shows an example of an nMOS regulated power supply, which is explained in the following. The nMOS regulated power supply shown at (A) of FIG. 6 includes a first driver 57 that consists of pMOS 53, a second driver 61 that consists of nMOS 59, a Vth canceller 62 that consists of nMOS 60 serving as a diode, and a resistance element 63. Here, the pMOS 51 and pMOS 52 constitute a current mirror circuit, and the nMOS 54, nMOS 55, and nMOS 56 constitute a differential amplifier 58.

The pMOS regulated power supply receives the step-up voltage Vpp, serving as the highest voltage, from the step-up power supply 13, the external power supply voltage Vcc, and the grounding voltage Vss, serving as the lowest voltage. The pMOS regulated power supply can be expressed as shown at (B) of FIG. 6.

The differential amplifier 58 of the nMOS regulated power supply shown in FIG. 6 receives the reference voltage Vref and a negative feedback voltage Vin. Because of the presence of the Vth canceller 62, a voltage equal to (Vin+Vth) is applied to the gate of the nMOS 59 of the second driver 61 (this means that the output voltage is lower than to the gate voltage of nMOS 55 by an amount equal to Vth by the Vth canceller 62). In this manner, a voltage that is lower than the gate voltage of the nMOS 59 by Vth is output from the source of the nMOS 59, that is, Vin is obtained.

Operations are explained in the following. The output voltage (Vin+Vth) of the first driver 57 is converted to Vin by the Vth canceller 62, and the Vin is supplied to the differential amplifier 58. The differential amplifier 58, the first driver 57, and the Vth canceller 62 control such that the output Vin output by the Vth canceller 62 and the reference voltage Vref become the same voltage. Consequently, the output voltage (Vin+Vth) of the driver 57 becomes equal to (Vref+Vth), and a voltage equal to the reference voltage Vref, which is lower than the gate voltage of nMOS 59 by Vth, is obtained from the source of the nMOS 59.

If there is no Vth canceller 62 present, a voltage equal to (Vref-Vth) is output from the second driver 61. Since the output voltage Vii becomes dependent of Vth, the output voltage Vii depends on temperature.

The nMOS regulated power supply shown in FIG. 6 has features as follows:

(1) since no feedback is applied to the output voltage Vii of the driver 61, the output voltage depends on the magnitude of load current, and further, when the power supply voltage Vcc of the driver 61 approaches the output voltage Vii according to a state of operation, a voltage (Vds) between the drain and the source of the nMOS 59 becomes small, causing a problem that the flat property is degraded;

(2) the driver 61 is constituted by nMOS (s), obtaining a high stability against noise in the external power supply voltage Vcc; and (3) output of the driver 57 is stable, requiring a slower response of the differential amplifier 58, which suppresses current drain of the differential amplifier 58 to the magnitude of $\mu$A.

While the nMOS regulated power supply has a high noise-resistant property, the flat property of the output voltage is low.

As described above, each of the pMOS regulated power supply and the nMOS regulated power supply has respective advantage and disadvantage.

In view of the low power consumption, the nMOS regulated power supply is often used.

In the nMOS regulated power supply shown in FIG. 6, the step-up voltage (Vpp) is used for the circuit that generates the gate voltage (VG) of the nMOS 59 in consideration of the influence of the loss of Vth of the second driver 61 that consists of nMOS 59.

Operation margin of a semiconductor integrated circuit is checked often by applying the Vpp from an external source, and by changing the voltage of Vpp. If Vpp is arbitrarily changed at the checking, the gate voltage of nMOS 59 of the second driver 61 is also changed. In order to avoid this situation, two Vpp generating circuits have been conventionally used, one being a Vpp generating circuit 73 for the memory core, and the other a Vpp generating circuit 71 for step-down power supply (for example, the nMOS regulated power supply as shown in FIG. 6) that generates Vii, as shown in FIG. 7.

Each of the Vpp generating circuit 73 for the memory core and the Vpp generating circuit 71 for step-down power supply consists of a Vpp detection circuit 81, an oscillation circuit 82 for Vpp generating, and a step-up circuit 83, as shown at (A) in FIG. 8. The Vpp detection circuit 81 detects the output voltage of the step-up circuit 83, and controls oscillation operation of the oscillation circuit 82 for Vpp generating, and the step-up circuit 83 operates by the output of the oscillation circuit 82 for Vpp generating.

An example of the Vpp detection circuit is explained with reference to FIG. 8. The Vpp detection circuit shown at (B) FIG. 8 consists of a resistance element 91, having a resistance value R91, a resistance element 92, having a resistance value R92, pMOS 93, nMOS 94, nMOS 95, pMOS 96 and nMOS 97, an inverter 98, and an inverter 99.

The pMOS 93 and pMOS 96 constitute a current mirror circuit, and nMOS 94, nMOS 95, and nMOS 97 constitute a differential amplifier.

The voltage of Vpp is divided by the resistance element 91 and the resistance element 92, and a voltage Vpp' is obtained, the value of which is obtained from a formula (1) that follows.

$$Vpp'=Vpp \times R92/(R91+R92) \qquad (1)$$

The voltage Vpp' is applied to the gate of the nMOS 94. Further, the reference voltage Vref is applied to the nMOS 95 and nMOS 97.

When Vpp' reaches Vref or becomes larger than Vref, namely, $$Vpp' >= Vref \qquad (2)$$

a high level signal H is output from the drain electrode of nMOS 97. The H signal is provided to the inverter 98, and then, to the inverter 99 that outputs the H signal as a Vdet signal.

On the other hand, when Vpp' is less than Vref, namely, $$Vpp' < Vref \qquad (3)$$

a low level signal L is output from the source electrode of the nMOS 97. The L signal is provided to the inverter 98, and then, to the inverter 99 that outputs the L signal the Vdet signal.

In the case as shown in FIG. 7, the Vpp detection circuit has to be provided to both the Vpp generating circuit 73 for the memory core, and the Vpp generating circuit 71 for the step-down power supply, which causes a problem from a view point of the power consumption.

Further, conventionally, in order to avoid the problem of power consumption, when testing, the Vii 23 (internal power supply voltage) is bridged to the step-up power supply line (Vpp power supply line), and the external power supply voltage that fluctuates is supplied to the step-up power supply line.

However, in the case of, e.g., Vii=1.5V and Vcc maximum=3.3V, more than twice the internal voltage is applied to the internal circuit, increasing charging/discharging current of a signal, resulting in a problem of a higher noise level of the power supply, and blocking of a circuit operation timing margin.

Furthermore, when a problem arises in a circuit when testing, it is impossible to determine whether the problem is due to the Vii becoming too high, or the voltage (Vgs) between gate and source becoming too high.

The present invention is made in view of the above-mentioned problems, and the objective of the present invention is to provide a testing method of a semiconductor integrated circuit, operational margins of which can be tested at low power consumption, and a semiconductor integrated circuit, operational margins of which can be tested at lower power consumption.

SUMMARY OF THE INVENTION

It is a general object of the present invention to provide a semiconductor integrated circuit, operation margins of which can be tested by applying a fluctuating voltage to a step-up power supply line, and a testing method therefor that substantially obviate one or more of the problems caused by the limitations and disadvantages of the related art.

Features and advantages of the present invention will be set forth in the description that follows, and in part will become apparent from the description and the accompanying drawings, or may be learned by practice of the invention according to the teachings provided in the description.

Objects as well as other features and advantages of the present invention will be realized and attained by the semiconductor integrated circuit, operational margins of which can be tested by applying fluctuating voltages to the step-up power line, and the testing method therefor particularly pointed out in the specification in such full, clear, concise, and exact terms as to enable a person having ordinary skill in the art to practice the invention.

To achieve these and other advantages and in accordance with the object of the present invention, as embodied and broadly described herein, the semiconductor integrated circuit of the present invention includes a first step-up power supply unit, and a second step-up power supply unit, among other things.

In the semiconductor integrated circuit of the present invention, an internal power supply circuit generates internal power based on power supplied from the first step-up power supply unit during normal operations.

The internal power supply circuit generates the internal power based on power supplied from the second step-up power supply unit during a test, with the first step-up power supply being put into stand-by mode.

In order to switch between the first step-up power supply and the second step-up power supply, switches are provided. The switches are capable of being operated by a test signal that is supplied from an external source. In this manner, power consumption required when testing the operational margins is lowered.

The semiconductor integrated circuit of the present invention can also be configured with one step-up power supply that provides power to the internal power supply circuit.

The semiconductor integrated circuit is tested by the testing method of the present invention, in which an external source provides power to the step-up power supply line, and another step-up power supply generates the internal power during testing.

During normal operations, the step-up power supply provides power to the step-up power supply line, and the step-up power supply generates the internal power.

The testing method includes switching of the power supply circuits for normal operations and for testing by operating switches in accordance with a test signal supplied from an external source.

The testing method of the present invention is suitable for testing the semiconductor integrated circuits of the present invention, which can be tested by fluctuating a voltage applied to the step-up power supply line.

BRIEF DESCRIPTION OF THE DRAWINGS

FIG. 3 is for explaining relations of voltages that are output from a step-down power supply, a step-up power supply, a pre-charge power supply, and a negative power supply when an external power supply is turned on;

DESCRIPTION OF THE PREFERRED EMBODIMENTS

In the following, embodiments of the present invention will be described with reference to the accompanying drawings.

Figure 9:
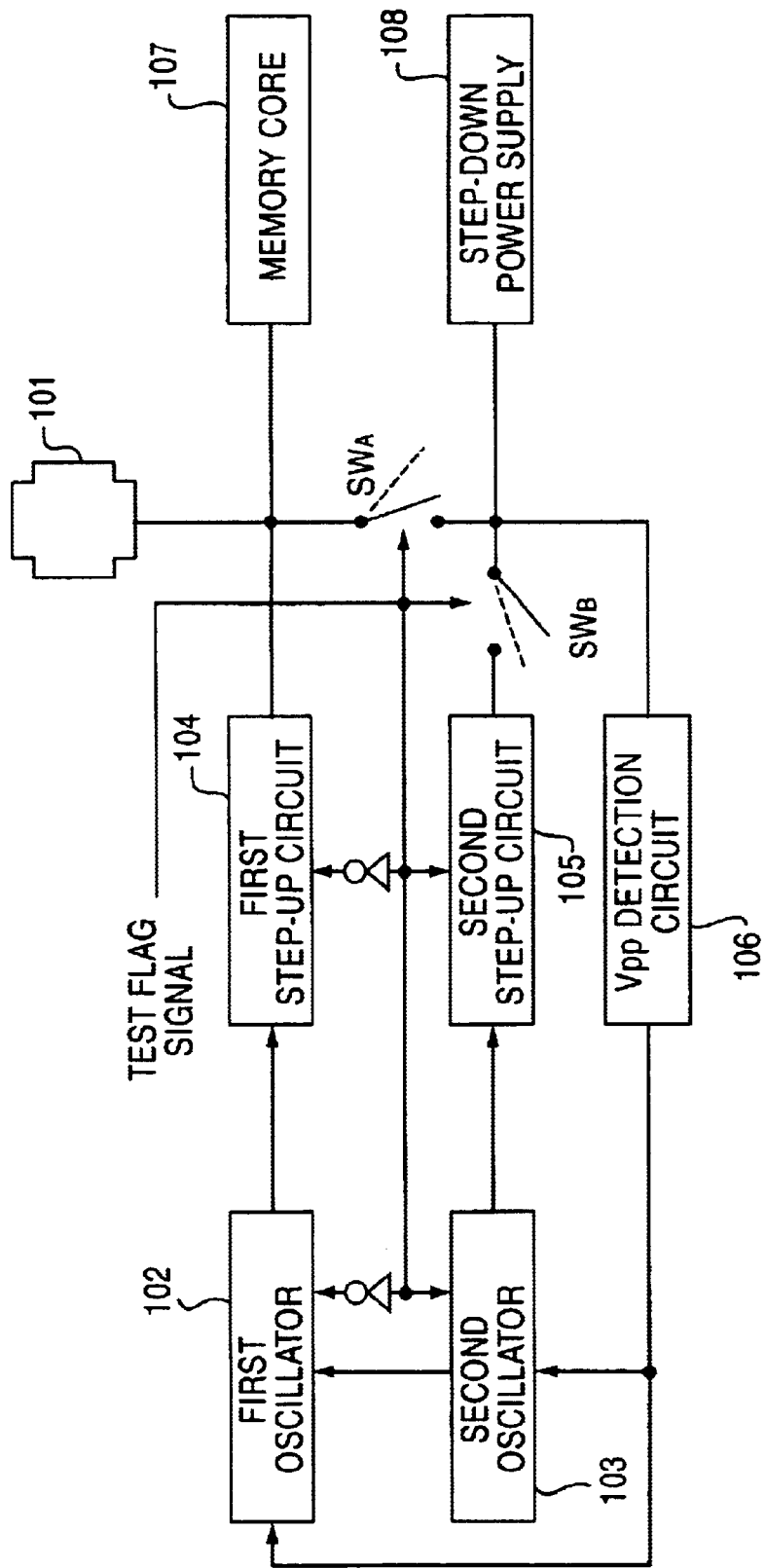
FIG. 9 is an example of a block diagram (No. 1) explaining an embodiment of the present invention.

FIG. 9 is a block diagram of a semiconductor integrated circuit according to the present invention, which can be tested by causing a voltage applied to a step-up power supply line to fluctuate. The semiconductor integrated circuit shown in FIG. 9 includes an external power supply connection terminal 101, a first oscillator 102, a second oscillator 103, a first step-up circuit 104, a second step-up circuit 105, a Vpp detection circuit 106, a memory core 107, a step-down power supply 108, a switch SWA, and a switch SWB.

Figure 10:
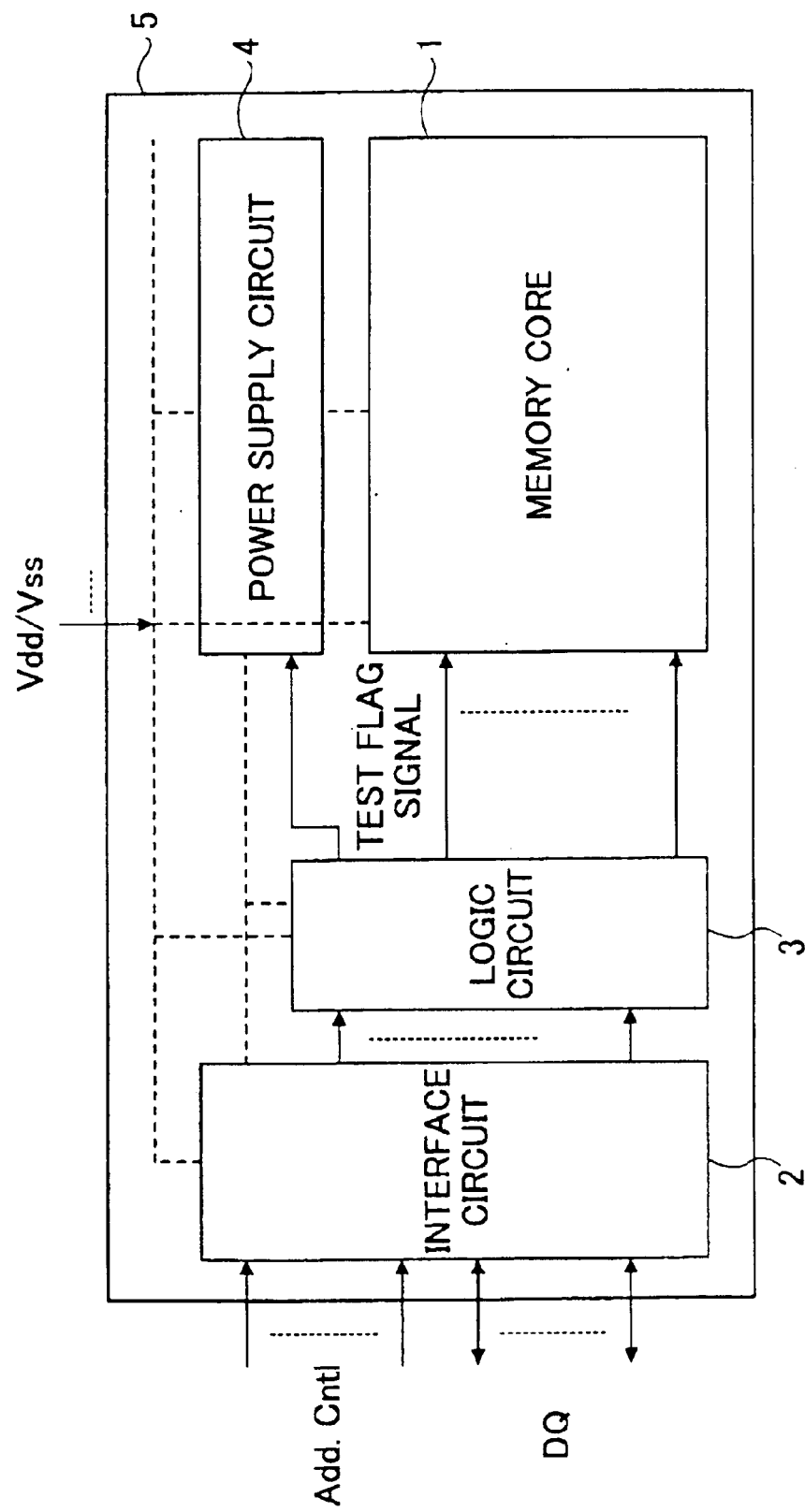
FIG. 10 is for explaining a test flag signal.

A TEST flag signal shown in FIG. 9 is, for example, a signal output by the logic circuit 3 to the power supply circuit 4 as shown in FIG. 10, the logic circuit 3 generating the signal when a test command and an address are supplied by CPU. Under normal operations, the TEST flag signal is in the low level L, the switch SWA is turned on, the switch SWB is turned off, the first oscillator 102 is active, the second oscillator 103 is in stand-by mode, the first step-up circuit 104 is active, and the second step-up circuit 105 is in stand-by mode. Further, since the switch SWA is turned on, the output of the Vpp detection circuit 106 becomes active. Consequently, the output of the first step-up circuit 104 is provided to the memory core 107 and the step-down power supply 108 under normal operations.

When testing, the TEST flag signal is in the high level H, the switch SWA is turned off, the switch SWB is turned on, the first oscillator 102 becomes in stand-by mode, the second oscillator 103 becomes active, the first step-up circuit 104 becomes in stand-by mode, and the second step-up circuit 105 becomes active. Further, since the switch SWB is turned on, the output of the second step-up circuit 105 is supplied to the step-down power supply 108. When testing, the external power supply voltage, which fluctuates, is connected to the memory core 107 through the external power supply connection terminal 101.

In this manner, as shown in FIG. 9, the semiconductor integrated circuit, operational margin of which can be tested reliably and with low power consumption, is realized.

Figure 11:
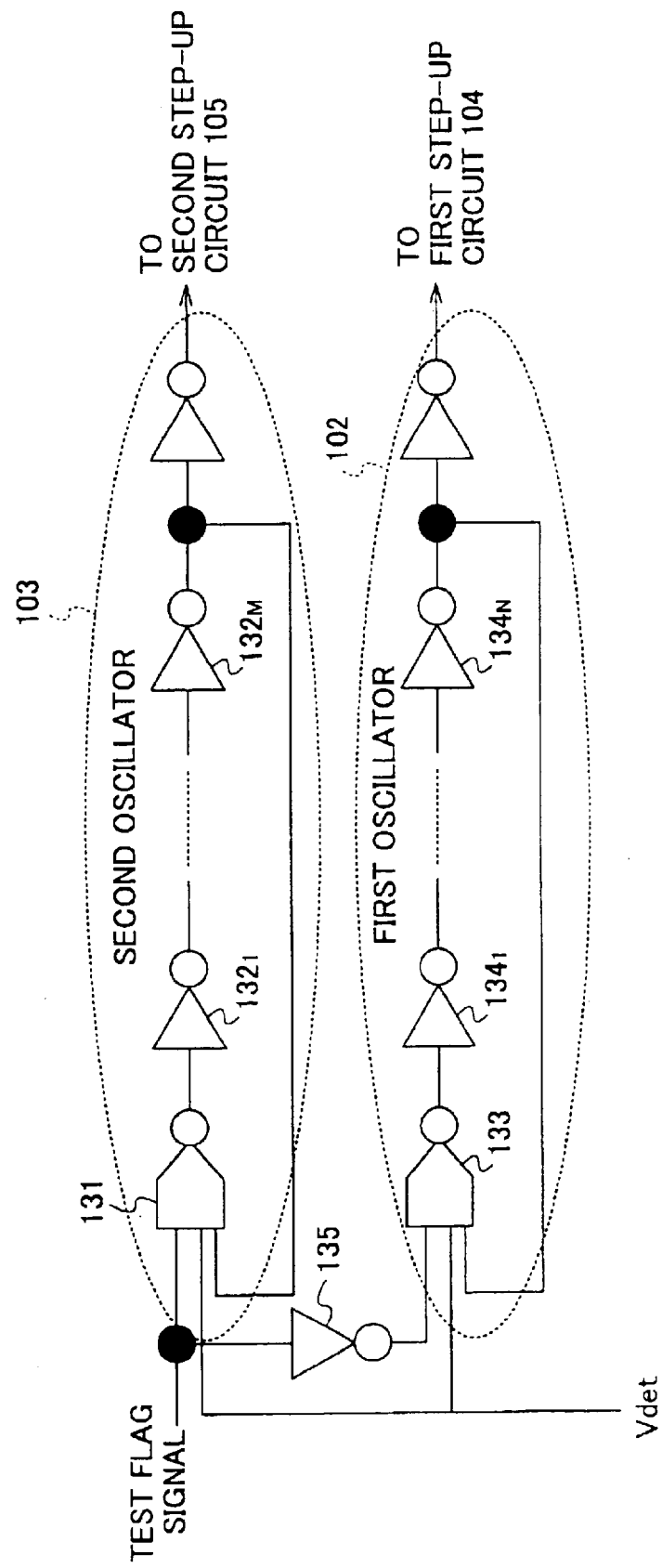
FIG. 11 is for explaining an example of an oscillator.

FIG. 11 shows an example of the first oscillator 102 and the second oscillator 103 shown in FIG. 9. The first oscillator 102 and the second oscillator 103 are feedback type oscillators. The first oscillator 102 includes a NAND circuit 133 and an inverter 1341 through inverter 134N, and the second oscillator 103 consists of a NAND circuit 131 and inverter 1321 through inverter 132M. When a high level signal H is provided to all the inputs of the NAND circuit 133, the first oscillator 102 oscillates. When a high level signal H is provided to all the inputs of the NAND circuit 131, the second oscillator 102 oscillates.

Figure 1:
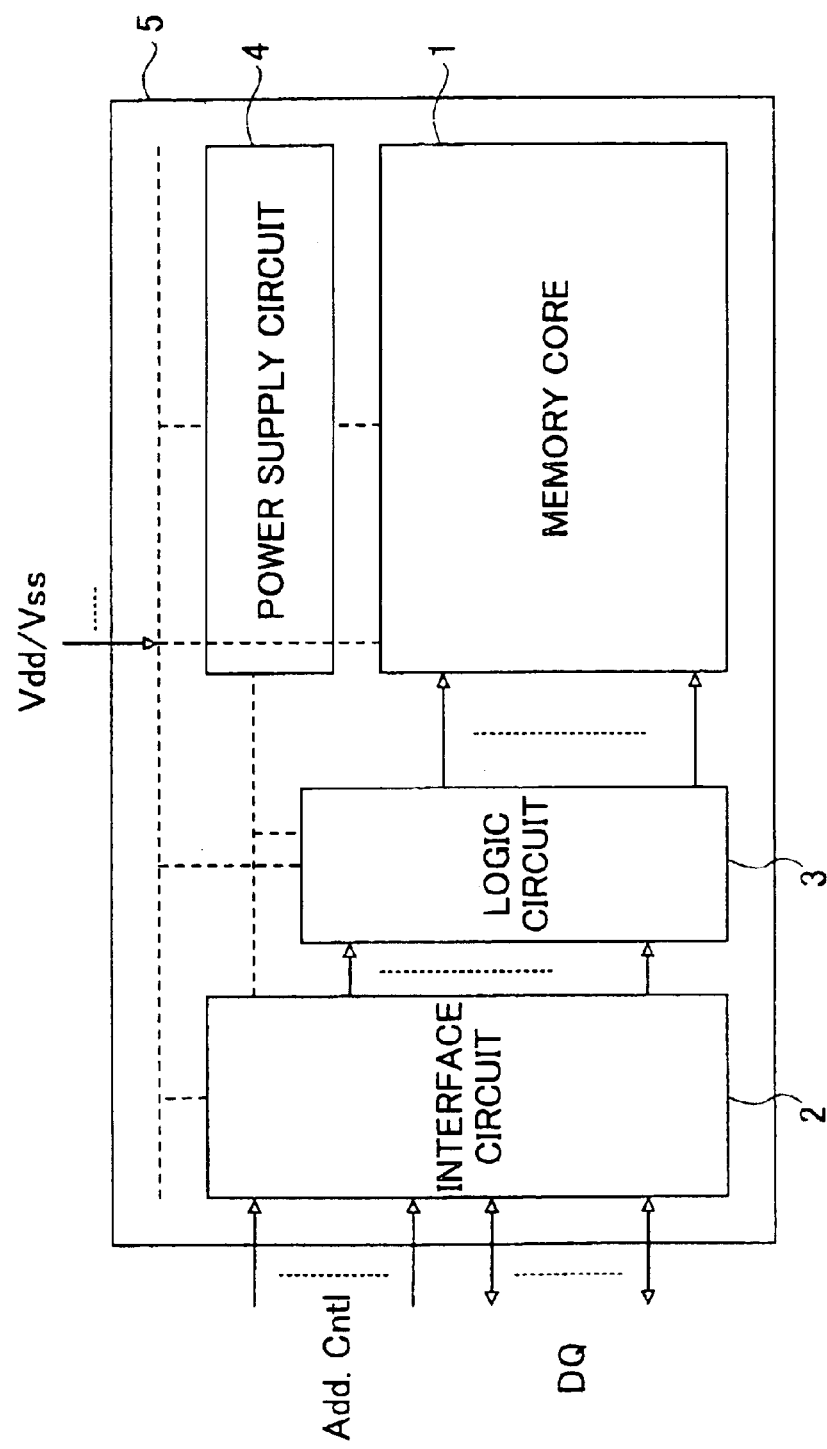
FIG. 1 is for explaining a conventional semiconductor integrated circuit.
Figure 2:
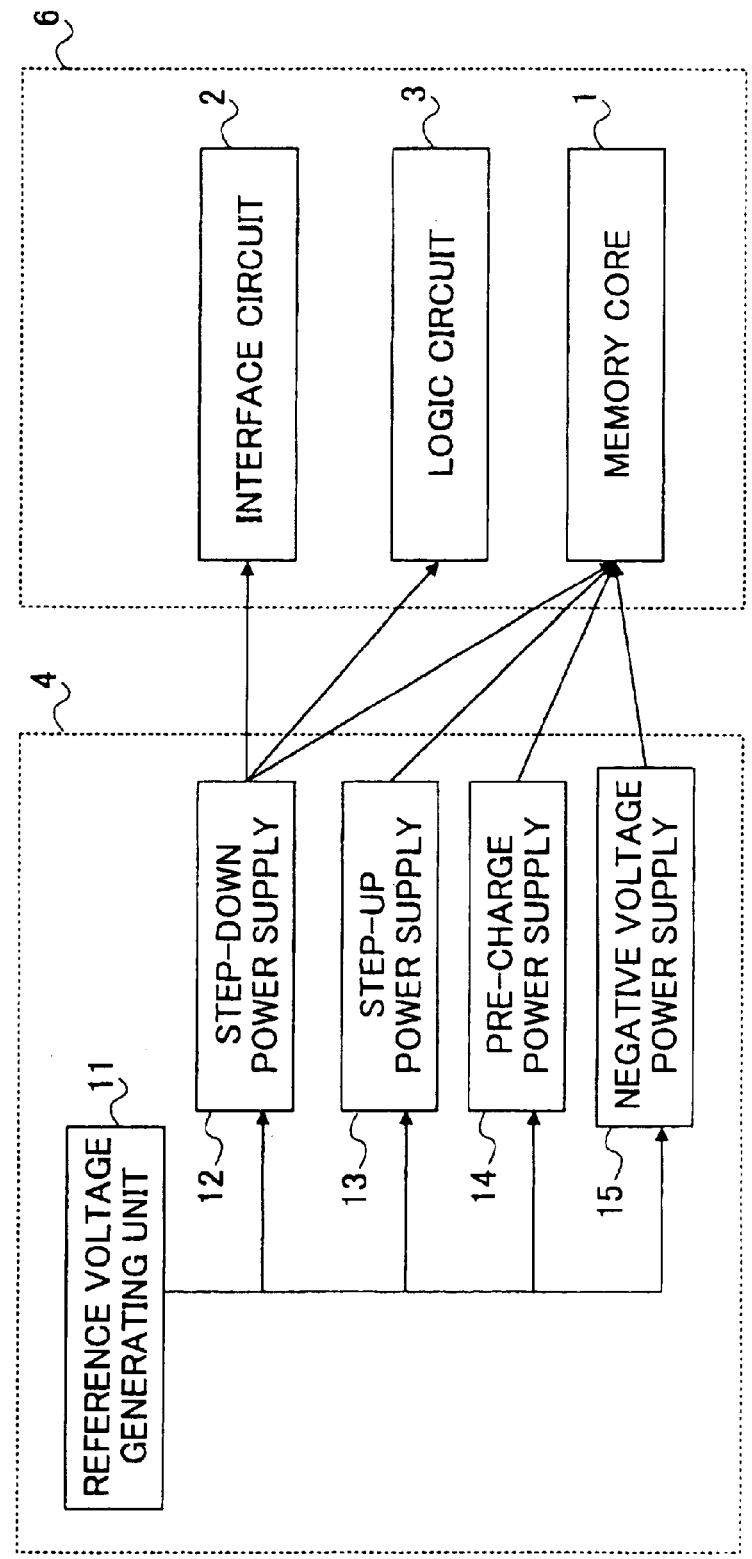
FIG. 2 is for explaining a power supply that a power supply circuit supplies.
Figure 3:
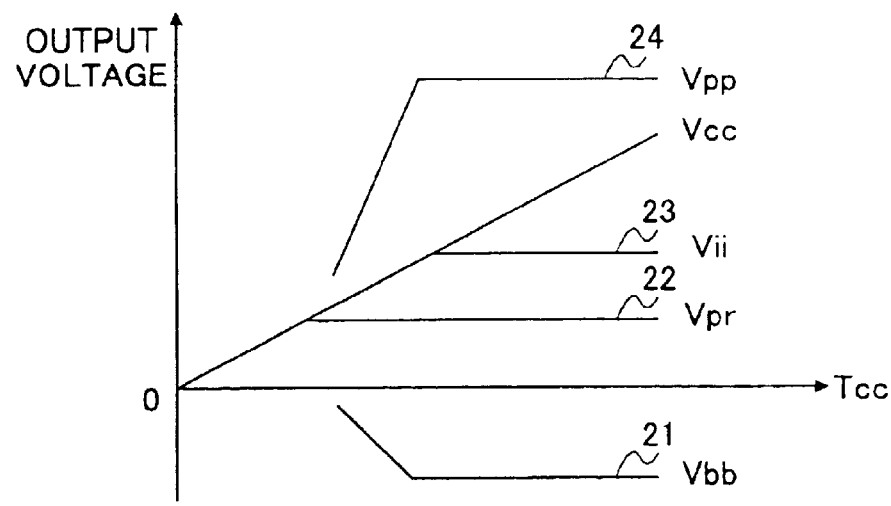
Figure 4:
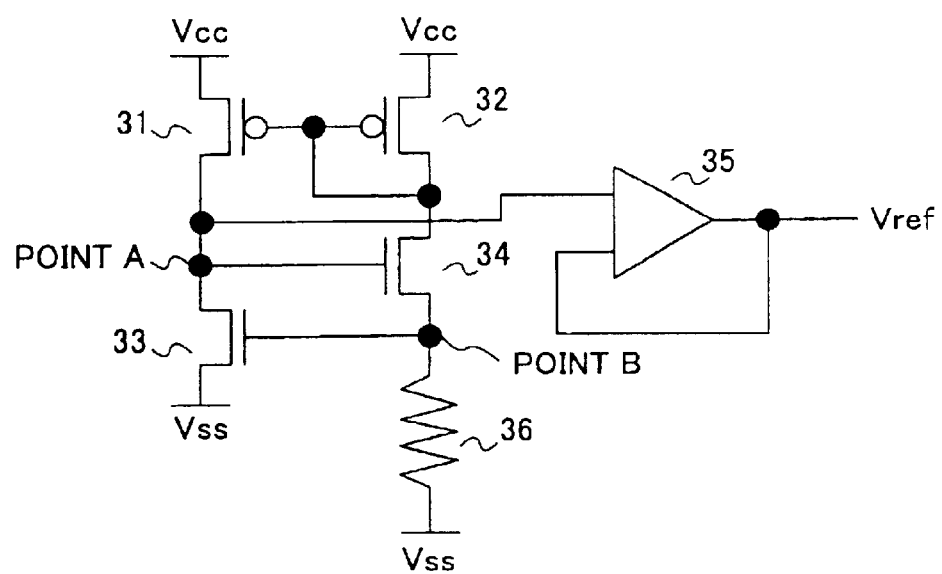
FIG. 4 is for explaining a reference voltage generating circuit of a reference voltage generator.
Figure 5:
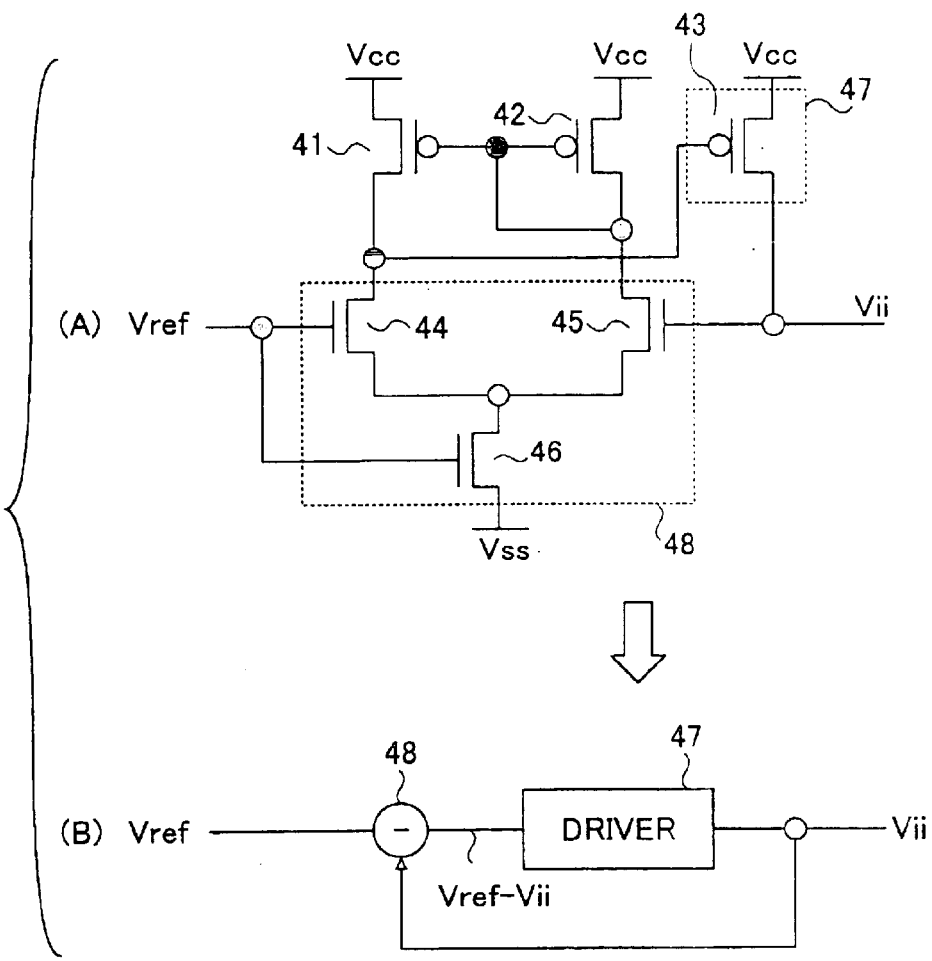
FIG. 5 is for explaining an example of a pMOS regulated power supply.
Figure 6:
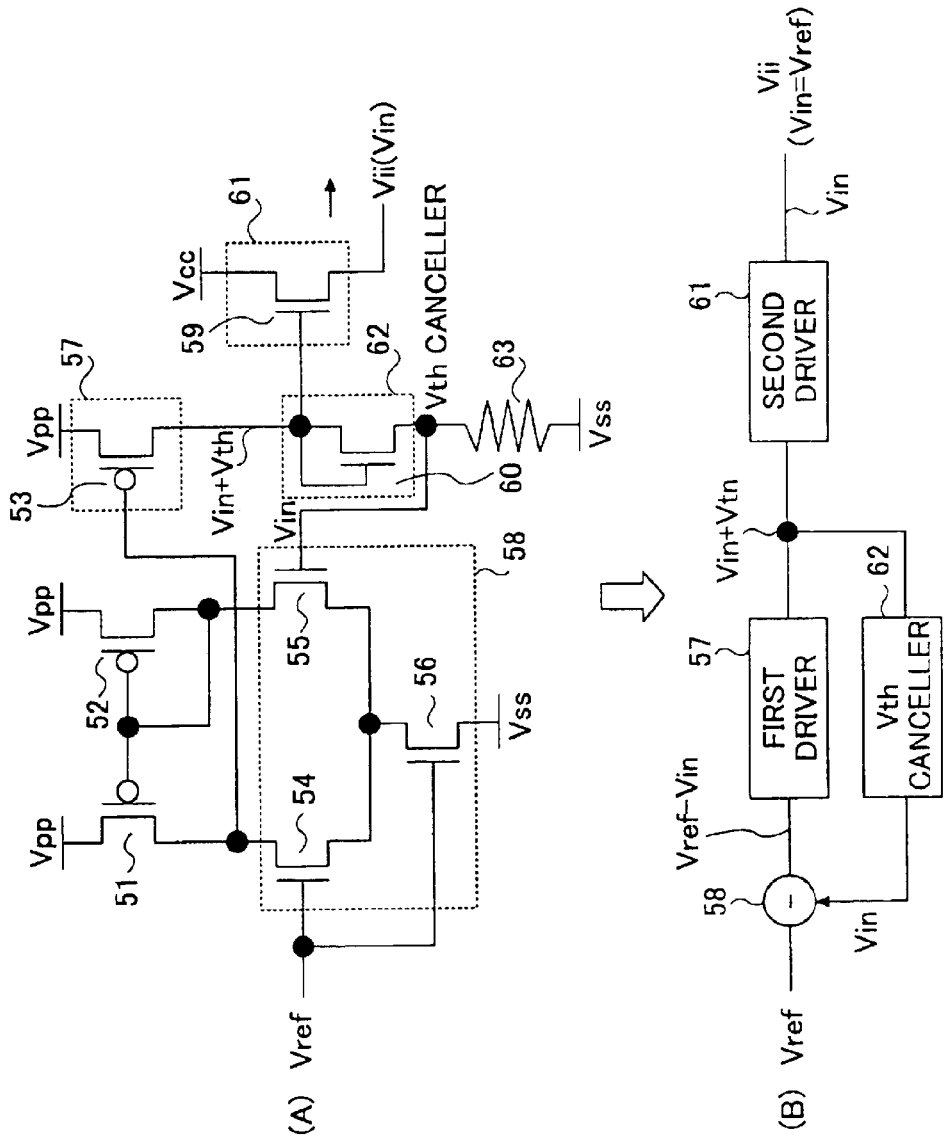
FIG. 6 is for explaining an example of an nMOS regulated power supply.
Figure 7:
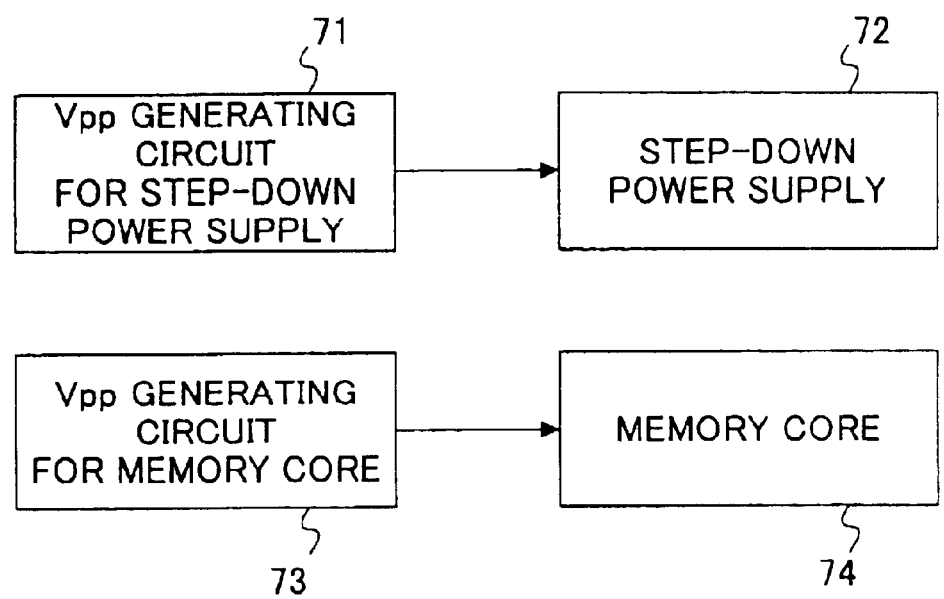
FIG. 7 is for explaining a conventional example, wherein a Vpp generating circuit for a memory core, and another Vpp generating circuit for a step-down power supply are provided.
Figure 8:
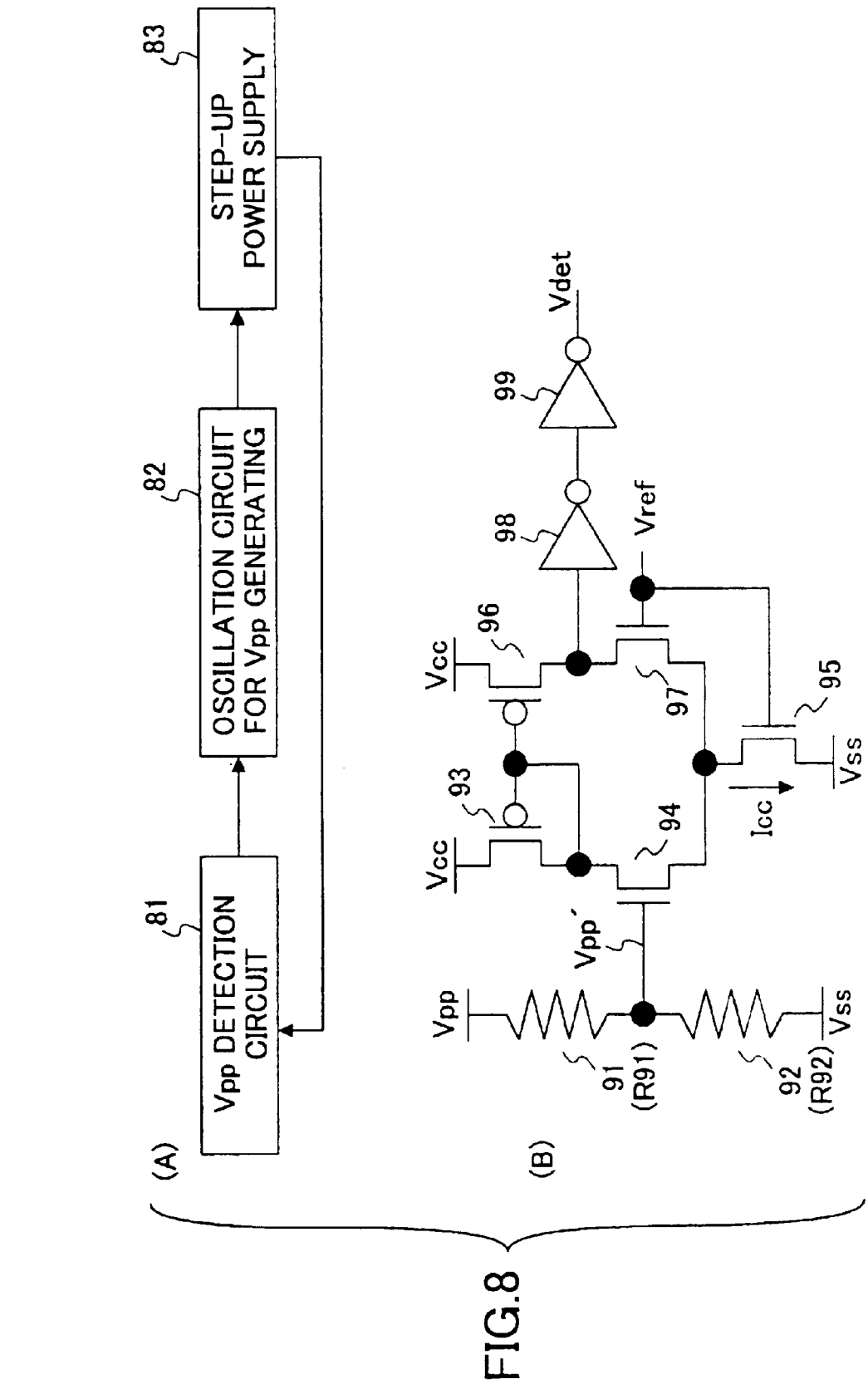
FIG. 8 is for explaining an example of a Vpp detection circuit used in FIG. 7.

A TEST flag signal is supplied to the second oscillator 103, and a reversed TEST flag signal is supplied to the first oscillator 102. Further, Vdet output from the Vpp detection circuit such as shown in FIG. 8 is supplied to the first oscillator 102 and the second oscillator 103.

Accordingly, when the Vdet signal is H, and when the TEST flag signal is H, the semiconductor integrated circuit is in the test condition, where the second oscillator 103 oscillates and the output is supplied to the second step-up circuit 105. On the other hand, when the Vdet signal is H, and when the TEST flag signal is L, the semiconductor integrated circuit is in normal operating condition, where the first oscillator 102 oscillates and the output is supplied to the first step-up circuit 104.

Figure 12:
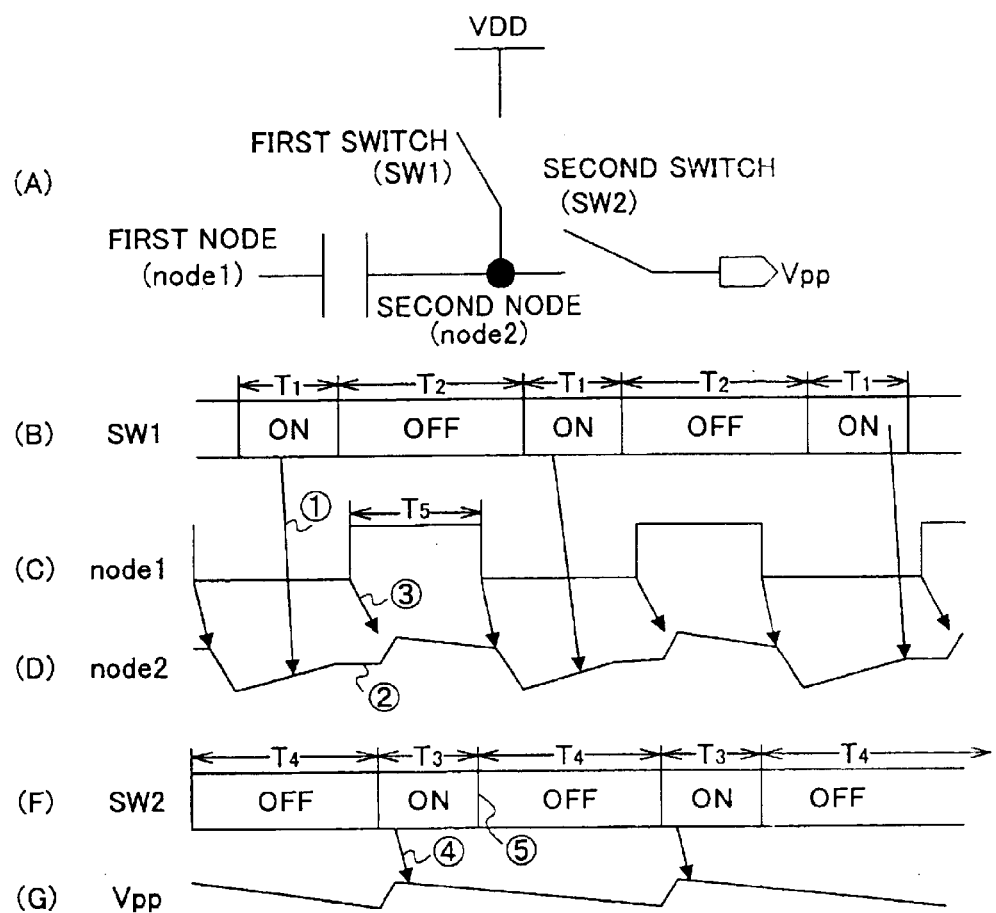
FIG. 12 is for explaining an example of a step-up circuit.

FIG. 12 shows an example of the first step-up circuit 104 and the second step-up circuit 105, which are shown in FIG. 9. In FIG. 12, a configuration of the step-up circuit is shown at (A), timing of ON/OFF of a first switch SW1 in the step-up circuit is shown at (B), a voltage of a first node in the step-up circuit is shown at (C), a voltage of a second node in the step-up circuit is shown at (D), timing of ON/OFF of a second switch SW2 is shown at (F), and a voltage of the output Vpp of the step-up circuit is shown at (G). Here, the ON/OFF timing of the first switch and the second switch is in accordance with, e.g., the output of the oscillator shown in FIG. 11.

Operations are explained.

(1) During a period T1, the first switch SW1 is put into an ON state, and the external power supply voltage VDD pre-charges the second node.

(2) Then, the first switch is put into an OFF state (period T2), disconnecting the external power supply voltage VDD.

(3) A high-level signal H is applied to the first node (period T5), and pumping is carried out to the second node.

(4) Almost simultaneously with applying the H signal to the first node, and the second switch is put into an ON state (period T3), making the voltage of the second node to be Vpp, which the step-up circuit outputs.

(5) Then, the second switch is put into an OFF state (period T4).

(6) Above-mentioned steps (1)–(5) are repeated.

Figure 13:
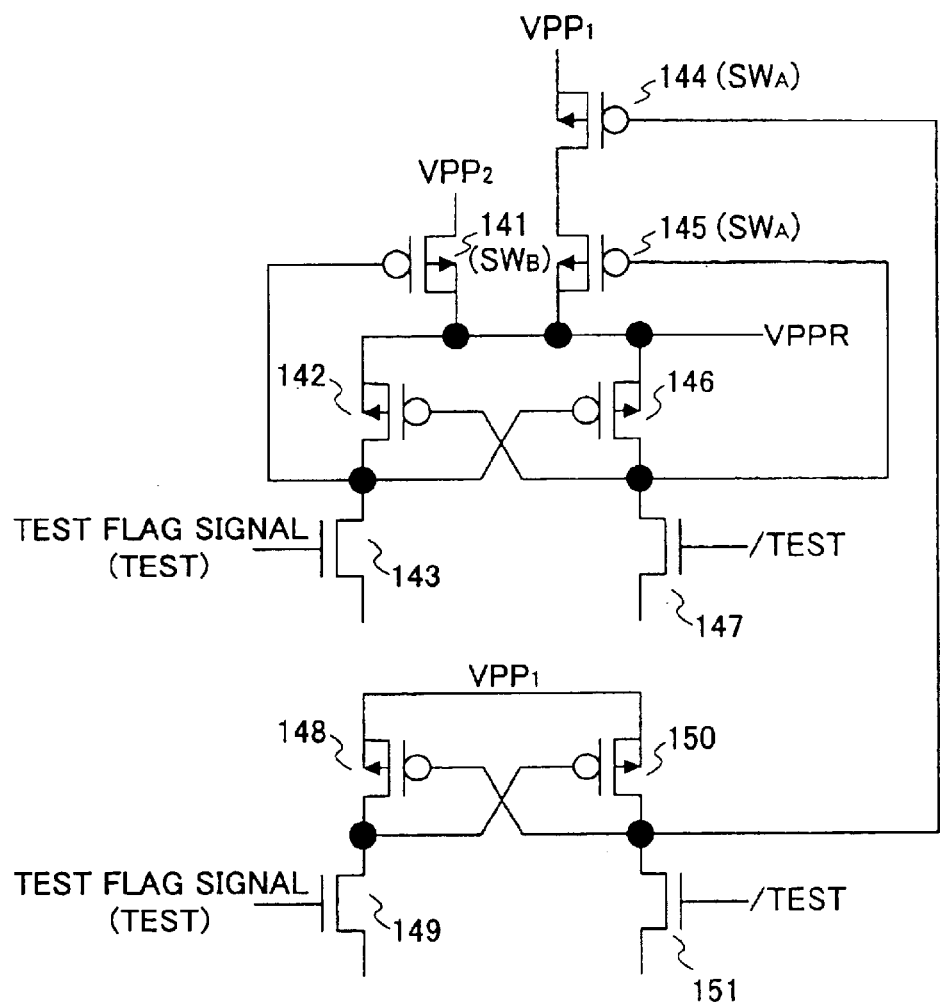
FIG. 13 is for explaining an example of a switching unit.

FIG. 13 shows an example of a switching unit that includes the switch SWA and the switch SWB in FIG. 9. The switching unit shown in FIG. 13 includes pMOS 141, pMOS 142, nMOS 143, pMOS 144, pMOS 145, pMOS 146, nMOS 147, pMOS 148, nMOS 149, pMOS 150, and nMOS 151. The first step-up circuit 104 and the external power supply connection terminal 101 in FIG. 9 are connected to the source electrode of pMOS 144, to which an output of the first step-up circuit 104 or an external power supply voltage VPP1 is applied. The second step-up circuit 105 in FIG. 9, e.g., provides a voltage VPP2 to the source electrode of the pMOS 141. The TEST flag signal is provided to the gate electrode of nMOS 143 and nMOS 149. The reversed TEST flag signal/TEST is provided to the gate electrode of nMOS 147 and nMOS 151. The pMOS 144 and pMOS 145 are equivalent to the switch SWA in FIG. 9, and the pMOS 141 is equivalent to the switch SWB in FIG. 9. An output signal VPPR shown in FIG. 13 is supplied to the step-down power supply 108 in FIG. 9. In addition, the pMOS 142 and pMOS 146 function as a level shift circuit when providing a gate signal to pMOS 141 and pMOS 145. Similarly, pMOS 148 and pMOS 150 function as a level shift circuit when supplying a gate signal to the pMOS 144.

Operations are further explained. Under normal operating conditions, the TEST flag signal is a low-level signal L. Accordingly, the nMOS 143 and nMOS 149 are in an OFF state, and the nMOS 147 and nMOS 151 are in an ON state. Since the drain electrode of the nMOS 147 and nMOS 151 are in the low level, the pMOS 144 and pMOS 145 are put into an ON state. On the other hand, since the nMOS 143 is in an OFF state, the drain electrode of nMOS 143 is in the high level, and the pMOS 141 is put into in an OFF state.

Consequently, the power supply voltage of VPP1 is output as the output signal VPPR. Under test conditions, the TEST flag signal is in the high level. Consequently, the nMOS 143 and nMOS 149 are in an ON state, and the nMOS 147 and nMOS 151 are in an OFF state. Since the drain electrode of the nMOS 147 and nMOS 151 are put into the high-level, the pMOS 144 and pMOS 145 are put into an OFF state. On the other hand, since the nMOS 143 is in an ON state, the drain electrode of the nMOS 143 is in the low level, and the pMOS 141 is put into an ON state.

Consequently, the power supply voltage of VPP2 is output as the output signal VPPR.

The conventional switching unit consists of pMOS 141, pMOS 142, nMOS 143, pMOS 145, pMOS 146, and nMOS 147. However, in this configuration, in the case of VPP1>>VPPR, the back bias of pMOS 145 becomes in a forward direction, and there is a problem that a correct testing by applying a voltage cannot be performed.

To avoid the above problem, the circuit of the present invention additionally employs the pMOS 144 as shown in FIG. 13. Further, the lower level shift is additionally employed, such that a sure control operation is obtained. In this manner, there are no cases where the back bias of the pMOS 145 becomes in the forward direction, and any arbitrary signals can be applied as VPP1.

Figure 14:
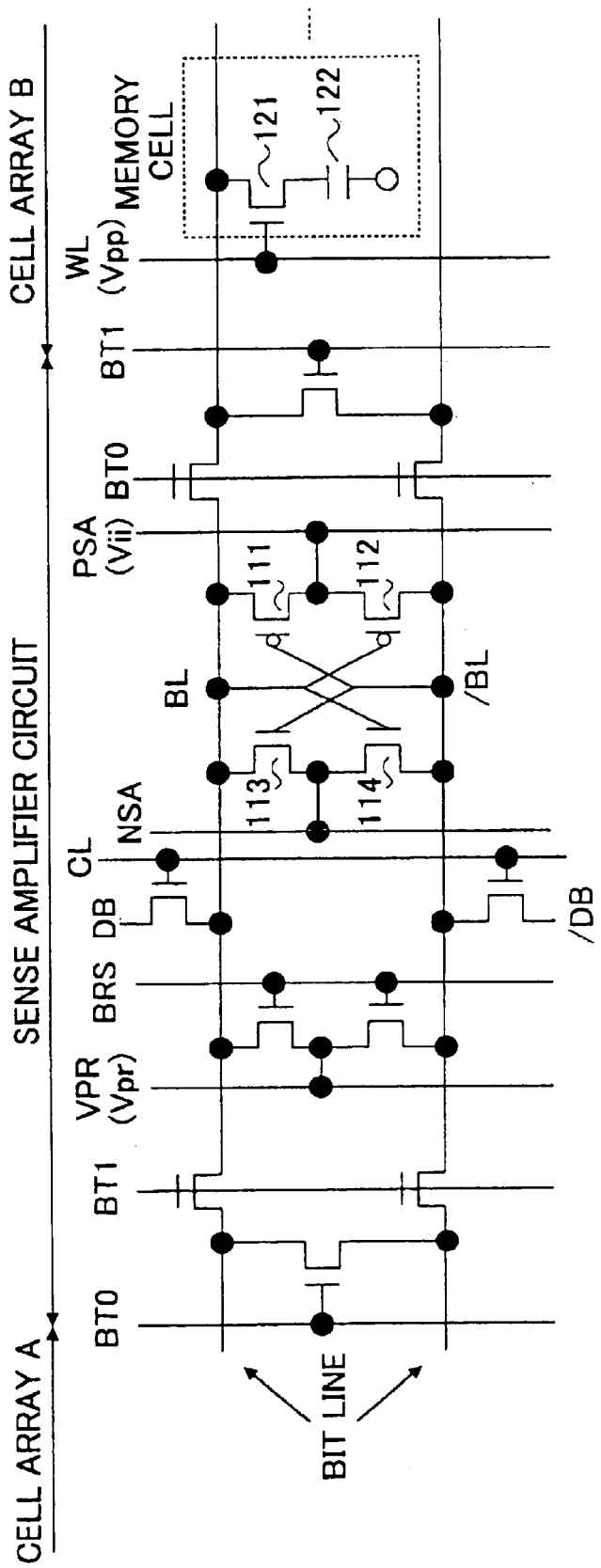
FIG. 14 is for explaining an example of the embodiment as applied to DRAM.
Figure 15:
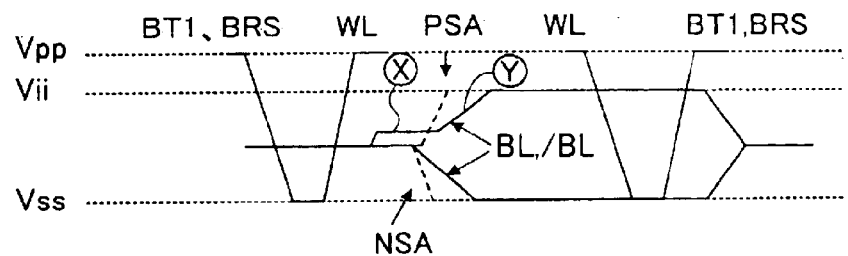
FIG. 15 is for explaining reading operations.

FIG. 14 and FIG. 15 are for explaining an example where the present invention as applied to DRAM. FIG. 14 is a circuit diagram showing a part of the memory core shown in FIG. 10. A sense amplifier circuit amplifies a signal of a cell array A and a cell array B. The sense amplifier circuit selects one of the cell arrays, according to a signal on lines BT0 and BT1. The memory cell includes nMOS 121 and a capacitor 122. Vpp is supplied to the gate of nMOS 121 through a word line WL. Further, the source of nMOS 121 is connected to a bit line BL, and one of the two ends of the capacitor 122 is connected to the drain of nMOS 121. Further, a cell plate voltage is supplied to the other end of the capacitor 122. Writing operation and reading operation of the memory cell are carried out by an ordinary method. Explanations follow about the power supply.

The internal power supply voltage (Vii) generated by the pMOS regulated power supply 71 or the nMOS regulated power supply 72 is supplied to a PSA line, and Vss is supplied to an NSA line. The internal power supply voltage (Vii) and Vss are supplied to bit lines BL and /BL, respectively, through pMOS 111, pMOS 112, nMOS 113, and nMOS 114. Based on the control signal provided to a BRS line, the pre-charge voltage Vpr is given between the bit lines BL and /BL through a VPR line at predetermined timing.

Based on FIG. 15, reading operations are briefly explained.

(1) In order to control a voltage between the bit lines to be at Vpr when the sense amplifier is non-active, a BRS signal is provided to the BRS line.

(2) One of the cell arrays that share the sense amplifier circuit is selected by the signal provided to the lines BT0 and BT1.

(3) Data of the capacitor 122 of the memory cell is read, based on a request to read, and the logic circuit generates a demand signal, and thereby, WL signal of the word line is activated, and is set to the Vpp level.

(4) When the Vpp is provided to the gate of nMOS 121, the electric charge (data) of the capacitor 122 is read (X).

(5) Amplified data are obtained on the bit lines BL and /BL by the signals of Vii and Vss that are supplied from the PSA line and the NSA line (Y).

(6) Data that are read are output by a DB line.

Figure 16:
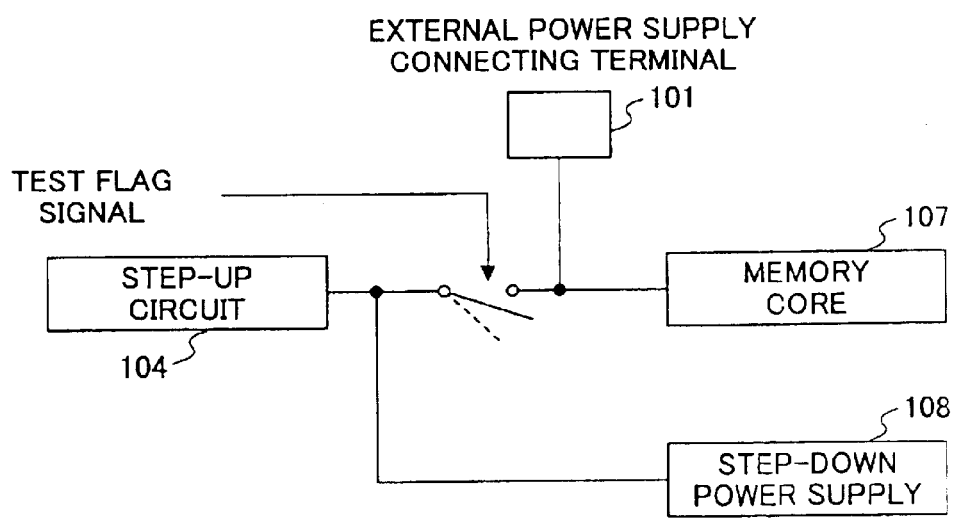
FIG. 16 is an example of a block diagram (No. 2) concerning the principal part of the embodiment of the present invention.

Here, although the example explained with reference to FIG. 9 used the first step-up circuit 104 and the second step-up circuit 105, an implementation is possible without the second step-up circuit 105, as shown in FIG. 16.

As described above, according to the present invention, the testing method of the semiconductor integrated circuit, operational margins of which can be tested at low power consumption, and the semiconductor integrated circuit that can be tested according to the testing method are realized.

Further, the present invention is not limited to these embodiments, but various variations and modifications may be made without departing from the scope of the present invention.

The present application is based on Japanese priority application No. 2001-364685 filed on Nov. 29, 2001 with the Japanese Patent Office, the entire contents of which are hereby incorporated by reference.

What is claimed is:

1. A semiconductor integrated circuit in which a device can be tested by causing a voltage applied to a step-up power supply line to fluctuate, comprising:
   an external power supply connection terminal connected to the step-up power supply line,
   a first step-up power supply,
   a second step-up power supply, and
   an internal power supply voltage generation circuit, wherein the external power supply connection terminal is connected to a fluctuating external power supply source, and the internal power supply voltage generation circuit generates internal power supply voltage based on power supplied from the second step-up power supply, when the device in the semiconductor integrated circuit is to be tested.

2. The semiconductor integrated circuit as claimed in claim 1, wherein the first step-up power supply provides power to the step-up power supply line, and the internal power supply voltage generation circuit generates internal power supply voltage based on the power from the first step-up power supply, when the semiconductor integrated circuit is under normal operating conditions.

3. The semiconductor integrated circuit as claimed in claim 1, wherein the first step-up power supply is put into a stand-by state, when the device in the semiconductor integrated circuit is to be tested.

4. The semiconductor integrated circuit as claimed in claim 3, wherein the first step-up power supply is put into a stand-by state by a test signal supplied from an external source.

5. The semiconductor integrated circuit as claimed in claim 1, further comprising:
   a first switch provided between the external power supply connection terminal and the internal power supply voltage generation circuit, and
   a second switch provided between the second step-up power supply and the internal power supply voltage generation circuit, wherein, the first switch is opened and the second switch is closed, when the device in the semiconductor integrated circuit is to be tested, and the first switch is closed and the second switch is opened when the semiconductor integrated circuit is under normal operating conditions.

6. The semiconductor integrated circuit as claimed in claim 5, wherein the first switch and the second switch are controlled by a test signal supplied from an external source.

7. The semiconductor integrated circuit as claimed in claim 5, wherein the first switch takes a two-stage configuration of MOS transistors, and a control signal for carrying out a level shift is supplied to a gate of each of the MOS transistors.

8. A semiconductor integrated circuit in which a device can be tested by causing a voltage applied to a step-up power supply line to fluctuate, comprising:
   an external power supply connection terminal connected to a step-up power supply line, a step-up power supply, and an internal power supply voltage generation circuit, wherein the external power supply connection terminal is connected to an external power supply source, the step-up power supply is disconnected from the step-up power supply line, and the internal power supply voltage generation circuit generates internal power supply voltage based on power supplied from the step-up power supply, when the device in the semiconductor integrated circuit is to be tested.

* * * * *